United States Patent [19]

Pepper et al.

[11] Patent Number: 5,072,140
[45] Date of Patent: Dec. 10, 1991

[54] AUTOMATIC GAIN CONTROL FOR INTERFEROMETERS AND PHASE SENSITIVE DETECTORS

[75] Inventors: Steven H. Pepper, Portland; Jeffrey H. Goll, Lake Oswego, both of Oreg.

[73] Assignee: Tektronix, Inc., Beaverton, Oreg.

[21] Appl. No.: 539,401

[22] Filed: Jun. 18, 1990

[51] Int. Cl.$^5$ .............................................. H03K 5/26
[52] U.S. Cl. ................................... 307/510; 307/491; 328/161
[58] Field of Search ............... 307/529, 491, 493, 494, 307/498, 510; 328/155, 158, 161, 133, 134; 333/109

[56] References Cited

U.S. PATENT DOCUMENTS

| | | | |
|---|---|---|---|
| 3,689,752 | 9/1972 | Gilbert | 328/160 |
| 3,955,096 | 5/1976 | Faulhaber | 328/161 X |
| 4,311,928 | 1/1982 | Hirata et al. | 328/161 X |
| 4,353,000 | 10/1982 | Noda | 307/493 X |

OTHER PUBLICATIONS

"A New Wide-Band Amplifier Technique", Barrie Gilbert, IEEE Journal, vol. SC-3, No. 4, Dec. 1968.
"Gallium Arsenide Integrated Circuit Testing Using Electrooptic Sampling", Kurt J. Weingarten, Ultrafast Electronics Laboratory, Stanford University, Stanford, Calif., Dec. 1987.

Primary Examiner—John S. Heyman
Assistant Examiner—Toan Tran
Attorney, Agent, or Firm—John D. Winkelman; Francis I. Gray

[57] ABSTRACT

An automatic gain control circuit for an interferometer or a phase sensitive detector reduces sensitivity to fluctuations in amplitude of input signals. A pair of currents from the phase sensitive detector that represents a detected phase difference are input to an automatic gain control ratio detector. The output of the automatic gain control ratio detector is a function of the ratio of the difference and sum of the phase sensitive detector currents that is substantially independent of intensity or amplitude fluctuations of the input signals.

3 Claims, 1 Drawing Sheet

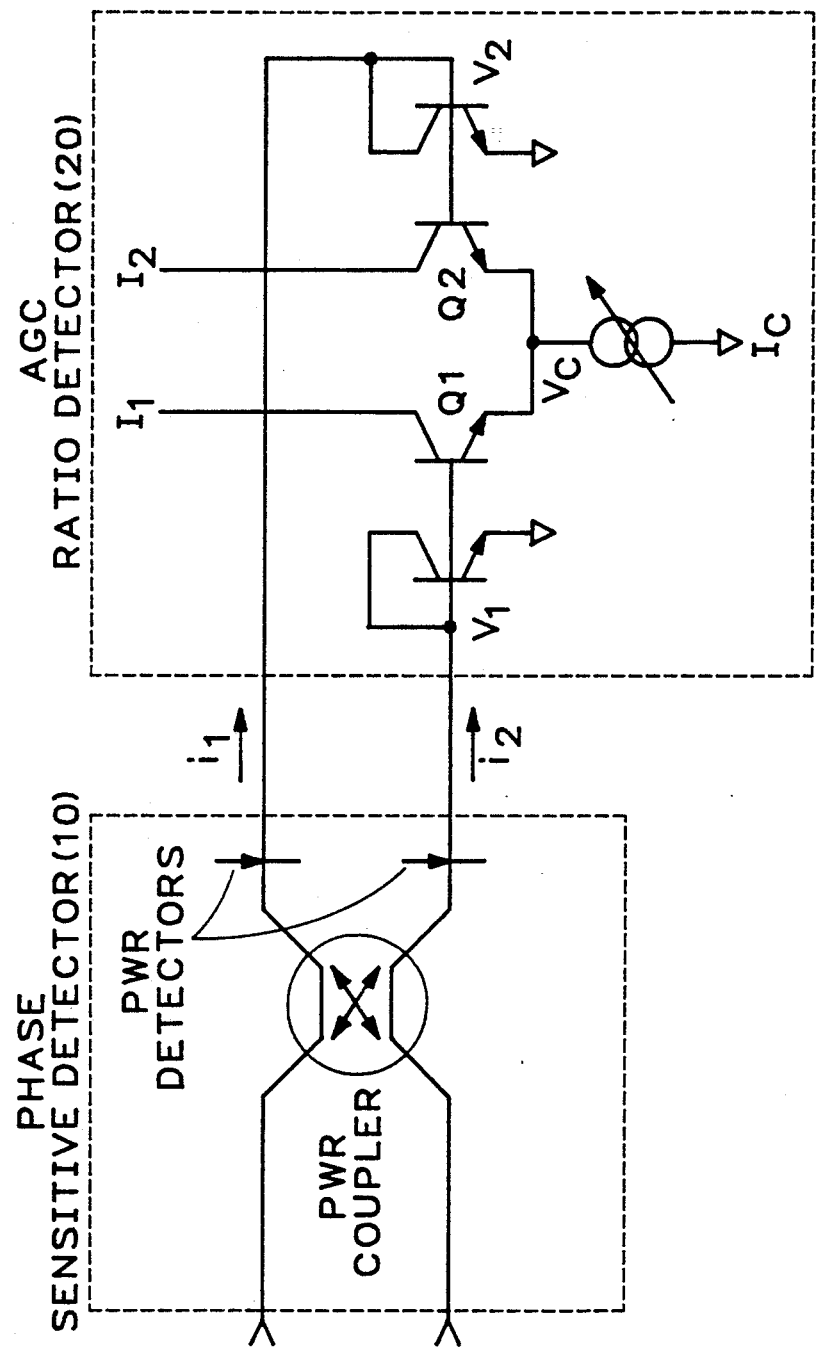

AUTOMATIC GAIN CONTROL FOR INTERFEROMETERS AND PHASE SENSITIVE DETECTORS

BACKGROUND OF THE INVENTION

The present invention relates to automatic gain control circuits, and more particularly to an automatic gain control circuit for phase sensitive detectors, such as interferometers for electrooptic, microwave or radio frequency (rf) systems as well as coherent detection systems, where the output is desired to be independent of fluctuations in the amplitude of an input signal.

An optical interferometer for an electrooptic system receives a beam of light and separates it with a beam or power splitter into two beams that travel separate optical paths, which beams have a phase or frequency difference between them determined by pressure, light, electricity, or the like. One of the paths is considered to be a "reference" path, and the other a "signal" path, although this distinction is arbitrary since it is the difference between the paths that is important. The beams are subsequently reunited by a power coupler and detected by appropriate photodetectors to produce a differential pair of output currents that represent the phase difference between the two optical paths. Alternatively for a coherent detection system one path includes a local oscillator signal as a reference and the other a phase or frequency modulated signal. The above description applies to microwave and rf systems as well as optical systems. To determine the phase difference between the modulated path and the reference path, either only one of the output currents have been used, or the difference between the output currents have been used. Alternatively the output current waveforms have been digitized and the results processed by software.

It has been suggested by Kurt J. Weingarten in a December 1987 dissertation entitled "Gallium Arsenide Integrated Circuit Testing Using Electrooptic Sampling" that first order intensity noise can be suppressed by normalizing the measured signal to the intensity fluctuations, i.e., using ratio detection. As shown in the block diagram of FIG. 2.12 a differencer & summer produces the sum and difference voltages from the input voltages, and then a divider obtains the ratio between the difference and sum voltages. Barrie Gilbert in the IEEE Journal of Solid-State Circuits, Vol. SC-3, No. 4, December 1968, and in U.S. Pat. No. 3,689,752, describes a wide band amplifier suitable for integrated circuits that has found common use as a multiplier. At page 358, FIG. 7 a multiple input version of the Gilbert circuit is shown where the inputs are known to be in a certain ratio with varying absolute values and it is desired to standardize the signals to a known amplitude. Further FIG. 8 shows the Gilbert circuit with a feedback connection to produce an output equal to the products or quotients of several inputs.

What is desired is a simple automatic gain control circuit for a phase sensitive detector that may be implemented in an integrated circuit and that reduces the unwanted sensitivity to amplitude variations in the input signals by using a ratio detector without the need for feedback.

SUMMARY OF THE INVENTION

Accordingly the present invention provides an automatic gain control circuit for a phase sensitive detector that reduces the sensitivity of the phase sensitive detector to fluctuations in amplitude of input signals. A phase sensitive detector, such as an interferometer or a coherent detection system, receives the input signals and produces a pair of output currents that are sensitive to fluctuations in the amplitude of the input signals as well as their phase difference. The output currents are input to an automatic gain control ratio detector that performs the function $K(i_1-i_2)/(i_1+i_2)$ where $i_1$ and $i_2$ are the output currents and K is an adjustable scalar.

The objects, advantages and other novel features of the present invention are apparent from the following detailed description when read in conjunction with the appended claims and attached drawing.

BRIEF DESCRIPTION OF THE DRAWING

The Figure is a schematic diagram view of an automatic gain control circuit for a phase sensitive detector according to the present invention.

DESCRIPTION OF THE PREFERRED EMBODIMENT

Referring now to the Figure a phase detector 10, such as the output of an interferometer for use as an electrooptic sampler or of a coherent detection system for use as a demodulator, has two input signals, one input signal being designated as a reference signal and the other being designated as a phase or frequency modulated signal. The input signals have a phase or frequency difference between them and may be derived from a single input signal. In an interferometer the modulated and reference signals are derived from a single input signal, the modulation resulting from a pressure, light, electrical or other signal that is being measured. In a coherent detection system the modulated signal is an input carrier signal modulated with information while the reference signal is a local oscillator signal. The two input signals are combined and detected to produce a pair of output currents, $i_1$ and $i_2$. The output currents from the phase detector 10 are input to an automatic gain control (AGC) ratio detector 20 having output currents $I_1$ and $I_2$ and a control current $I_c$.

The base to emitter voltage of a transistor is given by $V_{be} = (kT/q)\ln((I_e+I_o)/I_o)$, where $I_o$ is the reverse saturation current. By Kirchoff's law around the emitter loop $$V_1 - V_{be1} = V_c = V_2 - V_{be2}$$
$$\ln(i_1/I_o) - \ln(I_1/I_o) = \ln(i_2/I_o) - \ln(I_2/I_o)$$
$$i_1/I_1 = i_2/I_2$$

In terms of the differential mode currents:

$$I_d = I_1 - I_2$$

$$i_d = i_1 - i_2$$

and in terms of the common mode currents:

$$I_c = I_1 + I_2$$

$$i_c = i_1 + i_2$$

so $$I_d/I_c = i_d/i_c$$

or $$I_1 - I_2 = I_c(i_1 - i_2)/(i_1 + i_2)$$

to produce the desired result. The above derivation assumes "ideal" transistors having $a=1$ and $I_o$ close to zero. In fact there is an error term so that $$I_d = (i_d/i_c)I_c + 2(I_c/i_c)\{(I_o - (1-a)I_c/2)\}$$

where "a" is the collector to emitter current ratio whose frequency dependence determines the bandwidth limit of the transistors. The first term ($I_o$) of the error term, called the "reverse saturation current" of the transistor, is a simple additive offset that may be removed or otherwise made negligible compared to the other currents. The second term $((1-a)I_c/2)$ defines the bandwidth limit of the ratio detector. However the "break frequency" of the circuit may be made larger than the $f_t$ of the transistors, the frequency where $a=\frac{1}{2}$, by choosing $I_c$ to be less than $i_c$. Thus the gain may be traded off against bandwidth by reducing the output current vis a vis the input current so that the bandwidth is limited by gain rather than the transistor characteristics.

Thus the present invention provides an automatic gain control for a phase sensitive detector that reduces sensitivity to fluctuations of the input signal by inputting a pair of output currents from the phase sensitive detector to a automatic gain control ratio detector and obtaining the ratio of the difference of the output currents to the sum of the output currents from the outputs of the automatic gain control ratio detector.

What is claimed is:

1. An apparatus comprising:
    a phase detector having as inputs a reference signal and a modulated signal, and as outputs a differential input pair of currents representing an information signal derived from the phase difference between the modulated signal and the reference signal; and
    an automatic gain control ratio detector having as inputs the differential input pair of currents, and as outputs a differential output pair of currents representing a ratio of the difference of the input currents to the sum of the input currents that is independent of intensity amplitude fluctuations in the modulated and reference signals.

2. An apparatus as recited in claim 1 wherein the automatic gain control ratio detector comprises:
    a differential amplifier having the differential input pair of currents as inputs and the differential output pair of currents as outputs; and
    a pair of input devices, one for each input of the differential amplifier, coupled in parallel to the differential amplifier and having as inputs the differential input pair of currents.

3. An apparatus as recited in claim 2 wherein each input device comprises a transistor having the base and collector tied together and the emitter tied to a common voltage rail.

* * * * *